US008653822B1

(12) United States Patent  (10) Patent No.: US 8,653,822 B1
Dea  (45) Date of Patent: Feb. 18, 2014

(54) CHOPPERLESS AMBIENT ELECTRIC FIELD SENSOR

(75) Inventor: Jack Y. Dea, San Diego, CA (US)

(73) Assignee: The United States of America as represented by the Navy, Washington, DC (US)

( * ) Notice: Subject to any disclaimer, the term of this patent is extended or adjusted under 35 U.S.C. 154(b) by 346 days.

(21) Appl. No.: 13/030,298

(22) Filed: Feb. 18, 2011

(51) Int. Cl.
G01R 31/02 (2006.01)

(52) U.S. Cl.
USPC .............................. 324/457; 324/72

(58) Field of Classification Search
USPC .......... 324/72, 72.5, 452–458, 632, 658–663; 73/170.24; 340/601–602; 257/245
See application file for complete search history.

(56) References Cited

U.S. PATENT DOCUMENTS

| 4,101,825 | A * | 7/1978 | Truax | 324/458 |
| 5,315,232 | A * | 5/1994 | Stewart | 324/72 |
| 6,608,483 | B1 * | 8/2003 | Hill | 324/458 |
| 6,984,971 | B1 * | 1/2006 | Beasley et al. | 324/72 |
| 7,256,572 | B2 * | 8/2007 | Swenson et al. | 324/72 |
| 2005/0127890 | A1 * | 6/2005 | Swenson et al. | 324/72 |
| 2008/0122453 | A1 * | 5/2008 | Hunter | 324/661 |
| 2009/0102504 | A1 * | 4/2009 | Voigtlaender | 324/766 |
| 2009/0140720 | A1 * | 6/2009 | Koerner | 324/76.11 |
| 2009/0267634 | A1 * | 10/2009 | Nada et al. | 324/769 |

* cited by examiner

Primary Examiner — Melissa Koval
Assistant Examiner — Brent J Andrews
(74) Attorney, Agent, or Firm — Kyle Eppele (57) ABSTRACT

A chopperless ambient field apparatus and method is described having top and bottom sensing plates; a transistor-based device having first, second and third terminals; a first signal line coupled to the top plate and the first terminal of the device; a second signal line coupled to the bottom plate and the second terminal of the device; at least one controllable grounding circuit coupled to at least the first and second plates and to the first terminal of the device; an electrical parameter detector coupled to the second and third terminals of the device; and a protective enclosure disposed about the top and bottom plates, the device, and the detector, wherein with control of the grounding circuit, the detector measures AC fields and quasi-static DC electric fields impinging on the plates. A calibration procedure converts the unit to a DC measuring device.

12 Claims, 6 Drawing Sheets

CHOPPERLESS AMBIENT ELECTRIC FIELD SENSOR

FEDERALLY-SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone 619-553-2778; email: T2@spawar.navy.mil. Reference Navy Case No, 100,546.

BACKGROUND

This disclosure relates generally to ambient field sensors. In particular, this disclosure is related to chopperless ambient field detection sensors.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

In one aspect of the disclosed embodiments, a chopperless ambient field apparatus is provided, comprising: a stationary first metallic sensing plate; a stationary second metallic sensing plate, vertically displaced from and substantially parallel to the first plate; a transistor-based device having first, second and third terminals; a first signal line coupled to the first plate and the first terminal of the transistor-based device; a second signal line coupled to the second plate and the second terminal of the transistor-based device; at least one controllable grounding circuit coupled to the first and second plates and to the first terminal of the transistor-based device; an electrical parameter detector coupled to the second and third terminals of the device; and a protective enclosure disposed about the first and second plates, the transistor-based device, and the electrical parameter detector, wherein with control of the grounding circuit, the electrical parameter detector measures AC fields and quasi-static DC electric fields impinging on the plates.

In another aspect of the disclosed embodiments, a chopperless ambient field apparatus is provided, comprising: a stationary first metallic sensing plate; a stationary second metallic sensing plate, vertically displaced from and substantially parallel to the first plate; a transistor-based device having first, second and third terminals; a first signal line coupled to the first plate and the first terminal of the transistor-based device; a second signal line coupled to the second plate and the second terminal of the transistor-based device; a relay circuit coupled to the first and second signal lines; an electrical parameter detector coupled to the second and third terminals of the transistor-based device; a protective enclosure disposed about the first and second plates, the transistor-based device, and the electrical parameter detector; and a closed electric field enclosure disposed about the protective enclosure having a first openable aperture above the first plate and a second openable aperture below the second plate, wherein with control of the apertures and relay, the detector measures AC fields and DC electric fields impinging on the plates.

In yet another aspect of the disclosed embodiment, a chopperless ambient field apparatus is provided, comprising: a first sensing means for absorbing electric fields; a second sensing means for absorbing electric fields, the second sensing means being vertically displaced from and substantially parallel to the first sensing means; an active means for amplifying a signal, having first, second and third terminals; a first signal line coupled to the first sensing means and the first terminal of the active means; a second signal line coupled to the second sensing means and the second terminal of the active means; a means for interrupting a signal, being coupled to the first and second signal lines; a means for detecting an electrical parameter coupled to the second and third terminals of the active means; a protective enclosure disposed about the first and second sensing means, the active means, and the detecting means; and an openable enclosure means for controlling entry of electric fields, the openable enclosure means being disposed about the protective enclosure and having a first openable aperture above the first sensing means and a second openable aperture below the second sensing means, wherein with control of the apertures and means for interrupting a signal, the means for detecting measures AC fields and DC electric fields impinging on the sensing means.

In yet another aspect of the disclosed embodiments, a method for measuring ambient fields is provided, comprising: fixing a first metallic sensing plate and a second metallic sensing plate vertically and substantially parallel from each other; connecting a first signal line to the first plate and to a first terminal of a transistor-based device having first, second, and third terminals; connecting a second signal line to the second plate and to the second terminal of the device; connecting at least one controllable grounding circuit to the first and second signal lines; connecting an electrical parameter detector to the second and third terminals of the transistor-based device; disposing a protective enclosure about the first and second plates, the transistor-based device, and the electrical parameter detector; disposing a closed electric field enclosure about the protective enclosure, the electric field enclosure having a first openable aperture above the first plate and a second openable aperture below the second plate; closing the relay and the apertures to calibrate the electrical parameter detector; and opening the relay and the apertures for a predetermined period of time to allow ambient electric fields to impinge on the plates; and measuring the ambient AC fields and DC electric fields via a readout of the electrical parameter detector.

BRIEF DESCRIPTION OF THE DRAWINGS

The features and nature of the present disclosure will become more apparent from the detailed description set forth below when taken in conjunction with the drawings in which reference characters identify corresponding items and processes throughout.

DETAILED DESCRIPTION

The disclosed methods and systems below may be described generally, as well as in terms of specific examples and/or specific embodiments. For instances where references are made to detailed examples and/or embodiments, it should be appreciated that any of the underlying principals described are not to be limited to a single embodiment, but may be expanded for use with any of the other methods and systems described herein as will be understood by one of ordinary skill in the art unless otherwise stated specifically.

Ambient static or quasi-static electric field measurement is a significant challenge for scientists and engineers. For more than 100 years, the only reliable method has been the practice of chopping the ambient DC field into an AC field, and the AC field being then sensed with an AC voltage meter attached to field sensing plates. A DC voltage meter is not suitable for measurement because the charge in the field sensing plates will decay within several seconds, resulting in the DC voltage meter reading zero. An AC voltage meter is used because at AC conditions the accumulated charge does not have enough time to decay to zero. Therefore, using this chopping method, the instrument of choice has been the electric field mill.

To chop (or intermittently block out) the ambient electric field, the electric field mill uses rotating vanes that are spun by a small electric motor. A number of issues are apparent in this design. First, a significant amount of power is needed to run the motor, thereby often rendering it unsuitable for remote usage. Next, the motor itself introduces electrical noise which must be shielded away from the sensing plates. Further, the rotation speed of the vanes limits the bandwidth of the received signals to the period of the chopping interval (e.g., period of rotation). Also, the chopped signals require good signal (processing to eliminate the induced chopping modulation. Because of these requirements, the electric field mill is a very expensive instrument.

Figure 1:
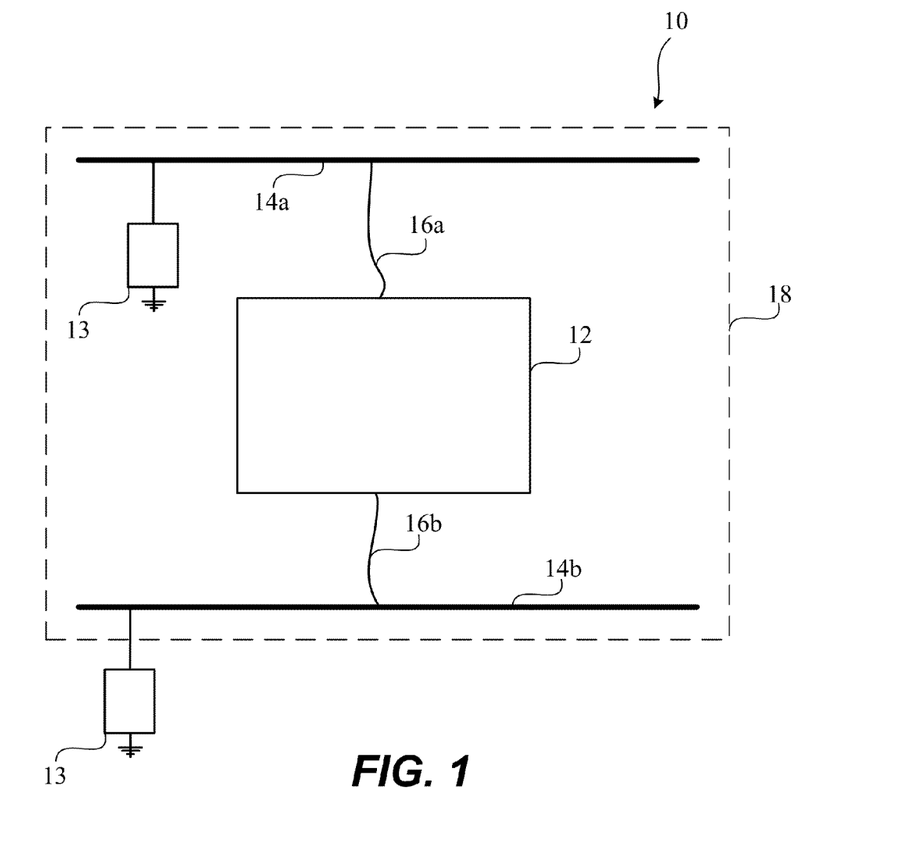
FIG. 1 shows the basic components of an exemplary chopperless ambient electric field sensor.

FIG. 1 is an illustration showing the basic components of an exemplary chopperless ambient electric field sensor 10. The exemplary sensor 10 comprises a transistor-based sensor module 12 coupled to upper and lower sensing plates 14a and 14b via signal lines 16a and 16b, respectively. Shunting to ground of the sensing plates 14a, 14b can be facilitated by grounding relays 13. A protective shield 18 that is transparent to electric fields is disposed about the components. The protective shield 18 can also be in the form of an encapsulating material and can be manufactured from any one or more of resins, plastics, glass, rubber, and so forth. In some embodiments, the protective shield 18 can be composed of multiple pieces, that is, having a removable cover with filler material, thereof. In this and other embodiments, the sensing plates 14a, 14b (which are made of a conducting material) are shown parallel to each other and vertically displaced to maximize sensitivity to the perpendicular gradient of terrestrial fields. In environments where the fields to be detected are not perpendicular from the terrestrial surface, other positions and/or orientations of the sensing plates may be contemplated, according to design preference. However, though the orientation and/or shape of the sensing plates 14a, 14b may be varied, it is understood that the sensing plates 14a, 14b are stationary and mechanical movement of them is not necessary for obtaining a field reading.

In operation, the sensor module 12 detects charge buildup and/or the voltage differential between the sensing plates 16a, 16b. Mechanisms (as further described below) in the sensor module 12 can sample the detected parameters for various time intervals to determine the detected ambient field values. It should be understood that in this and the following embodiments, power sources that may be necessary to operate the exemplary embodiments are not described, as they are implicit in the designs and may be implemented in any manner suitable according to the knowledge and understanding of one of ordinary skill in the art. For example, in some embodiments, a charging capacitor may be used as a power source, or a rechargeable battery, and so forth. Therefore modifications regarding the use, type and form of power sources may be implemented without departing from the spirit and scope of this disclosure.

Figure 2:
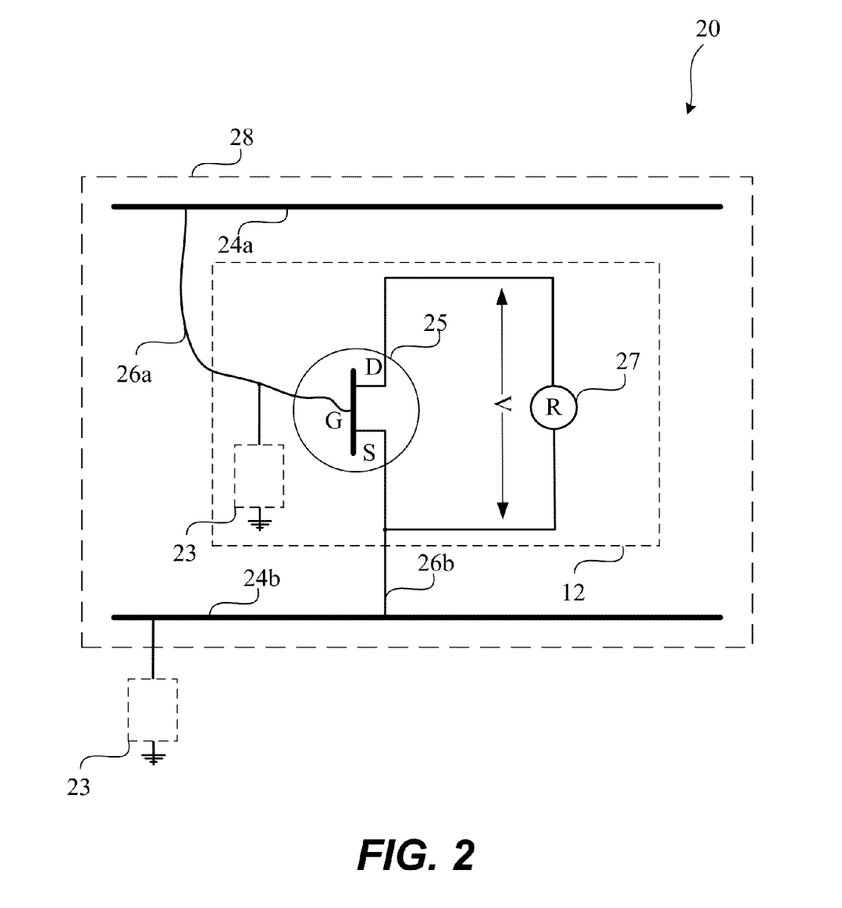
FIG. 2 shows a more detailed description of an exemplary chopperless ambient electric field sensor.

FIG. 2 is an illustration showing a more detailed description of the components of an exemplary chopperless ambient electric field sensor 20. In this illustration, the sensor module 12 is shown using a three-terminal depletion mode N-channel metal-oxide-semiconductor-field-effect-transistor (MOSFET) transistor 25 with the associated gate (G), drain (D), and source (S) terminals. The gate terminal (G) of the transistor 25 is coupled to the top sensing plate 24a via signal line 26a and the source terminal (S) of the transistor 25 is coupled to the bottom sensing plate 24b via signal line 26b. An electrical parameter detector 27, a non-limiting example being a resistance meter (R), is coupled to the drain terminal (D) and source terminal (S) of the transistor 25, to provide a resistance reading or equivalent voltage (V). Optional biasing circuit 23 is shown coupled to the input (e.g., gate terminal) of the transistor 25 for optionally biasing the transistor 25 into an optimal quiescent mode, if so desired, and also to sensing plates 24a, 24b. In the later configuration the optional biasing circuit 23 can function as a shunting circuit to ground out any buildup of charge/field on the sensing plates 24a, 24b.

Any one or more transistor biasing approaches including, and not limited to, additional transistor circuitry, tera-Ohm resistors, leaky capacitors, and so forth, may be used in the biasing circuit 23, as needed. An electric field transparent protective enclosure 28 is disposed about the entire assembly to protect the exemplary sensor 20 from any mechanical intrusion, such as, for example, moisture or dirt, etc.

In operation, the sensing plates 24a, 24b are controllably exposed to ambient fields (and/or the sensing plates 24a, 24h are controllably un-grounded). The ambient fields build up charges on the exposed sensing plates 24a, 24b which affects the gate charge on the transistor 25. Variation of the gate charge (and/or voltage) is known to affect the resistivity (and/or voltage differential) of the drain-to-source junction of the transistor 25. Optional biasing circuit 23 may be utilized to increase the response characteristics of the transistor 25. As the transistor 25 is responding to the gate charge, resistance meter 27 detects the variation of the transistor's 25 drain-to-source response and based on the output of the electrical parameter detector 27, a time-based reading which is proportional to AC fields and quasi-static DC electric fields that impinge upon the exemplary device 20 can be obtained.

It should be apparent that other forms of transistors, such as an ultra-high impedance transistor (e.g., non-MOSFET), or detection circuitry may be utilized according to the knowledge of one of ordinary skill in the art. Therefore, alternative transistor types (for example, BiFET, MOSFET, IGBT, etc.) that can be suitably configured may be used without departing from the spirit and scope of this disclosure.

Figure 3:
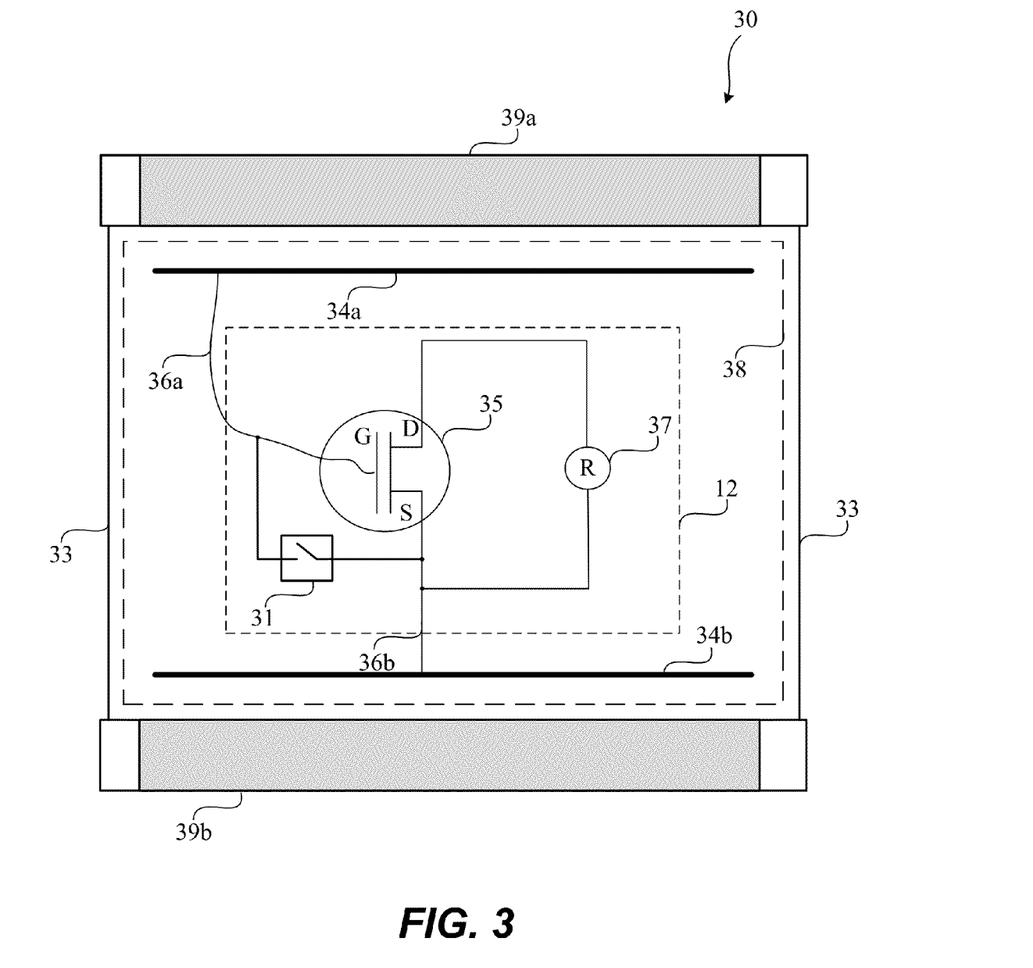
FIG. 3 shows another exemplary chopperless exemplary ambient electric field sensor using shutters.

FIG. 3 is an illustration showing another exemplary embodiment 30 using shutters 39a, 39b for controlling exposure of the exemplary device to the ambient fields. Two shutters 39a, 39b are disposed above and below lateral shields 33. The shields 33 controllably prevent any ambient fields from entering the protective enclosure 38 housing the sensing plates 34a, 34b and the sensor 30. A relay 31 is coupled between the signal lines 36a and 36b, and operates as a shunt to bypass the transistor 35. The relay 31 may close in sync with the closing of the shutters 39a, 39b. Additionally, the relay 31 may close for a fraction of a second during each sampling period (possibly lasting from many minutes to hours) in which the shutters 39a, 39h are open. In this latter instance, the momentarily closed relay 31 operates to "reset" the sampling period, thus nullifying any drift that may accumulate over a longer sampling period. In various modes of operation, the shutters 39a, 39b can be opened for long periods, such as 30 minutes, and closed for a fraction of a second for zero reading calibration. When the shutters 39a, 39b are opened, the sensing plates 34a, 34b are recharged by the ambient field entering the shielding enclosure 38. By controllably closing and opening the relay 31 and shutters 39a, 39b, the exemplary sensor 30 can measure totally DC static fields as well as AC fields.

Figure 4A:
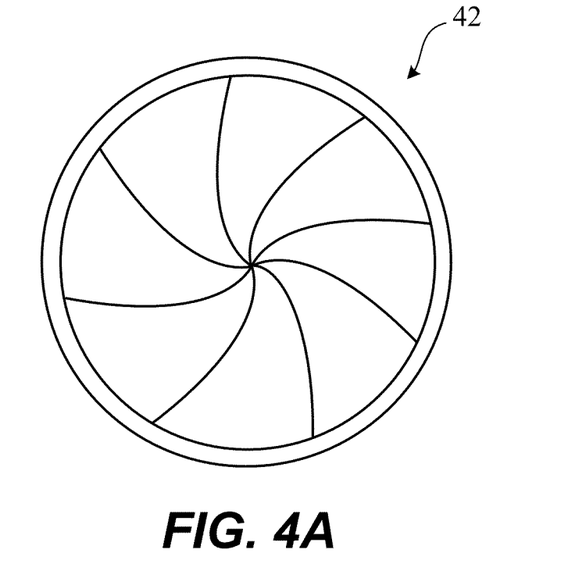
FIGS. 4A-B show various shuttering systems.
Figure 4B:
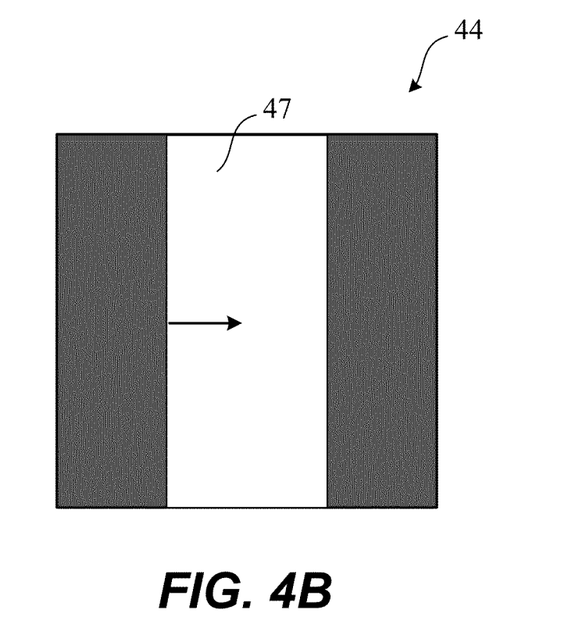

It should be appreciated that while the embodiment shown above describes the use of shutters 39a, 39b, other types of controllable exposing systems be utilized. For example, FIG. 4A illustrates a camera shutter system 42 (in a closed position) which is known to be relatively inexpensive and simple in operation and has been found to be well suited for use in the exemplary embodiments. FIG. 4B illustrates another exposure system using a looped sliding window system 44 with an opening 47 that can be "rolled" into position when exposure is desired and rolled out of position when exposure is not desired. As is apparent, numerous other types of exposure systems can be employed and therefore, modifications and changes to the types of exposure systems used can be made without departing from the spirit and scope of this disclosure.

Figure 5A:
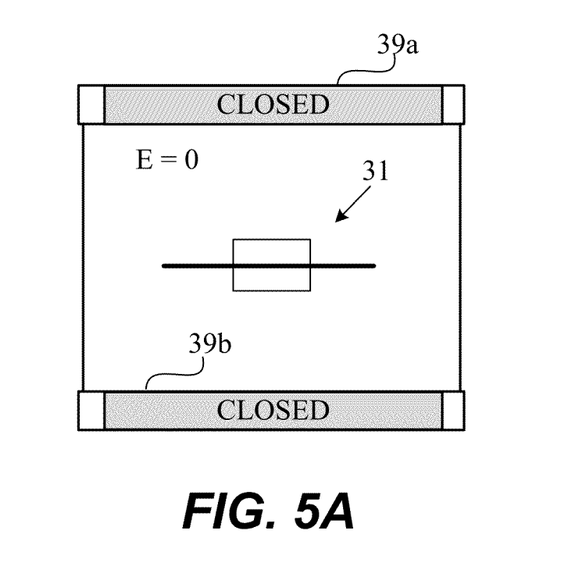
FIGS. 5A-B show a calibration and detection mode sequence for an exemplary chopperless ambient electric field sensor.
Figure 5B:
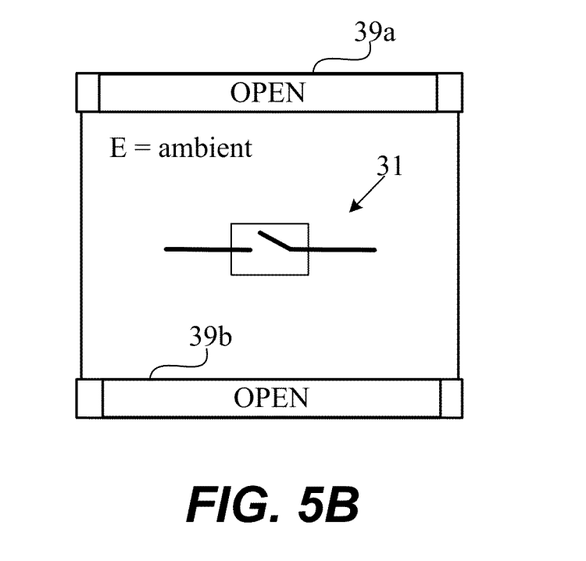

FIGS. 5A-B are illustrations showing a calibration and detection mode sequence for the shutters 39a, 39b and relay 31 of the embodiment of FIG. 3, respectively. In FIG. 5A, when an exemplary sensor is turned "on," shutters 39a, 39b can be closed for a momentary period of time (e.g., more or less than 1/10 of a second) resulting in the interior ambient field to be zero (E=0). The relay 31 can be closed in sync with the shutters 39a, 39b. The closed shutters 39a, 39b produce an interior zero field environment and the closed relay 31 shorts the gate and source of the transistor (not shown), resulting in a "zero" field detected condition. These conditions automatically calibrate the exemplary sensor and no further calibration is needed.

In FIG. 5B, when the shutters 39a, 39b and relay 31 are opened for an extended period of time (e.g., 30 minutes, which can be shorter or longer) the interior ambient electric field will be non-zero and the sensor will measure this ambient electric field for a predetermined period of time. The sequence of FIGS. 5A-B can then be repeated, as desired, to render sampled readings over extended periods of time.

Figure 6:
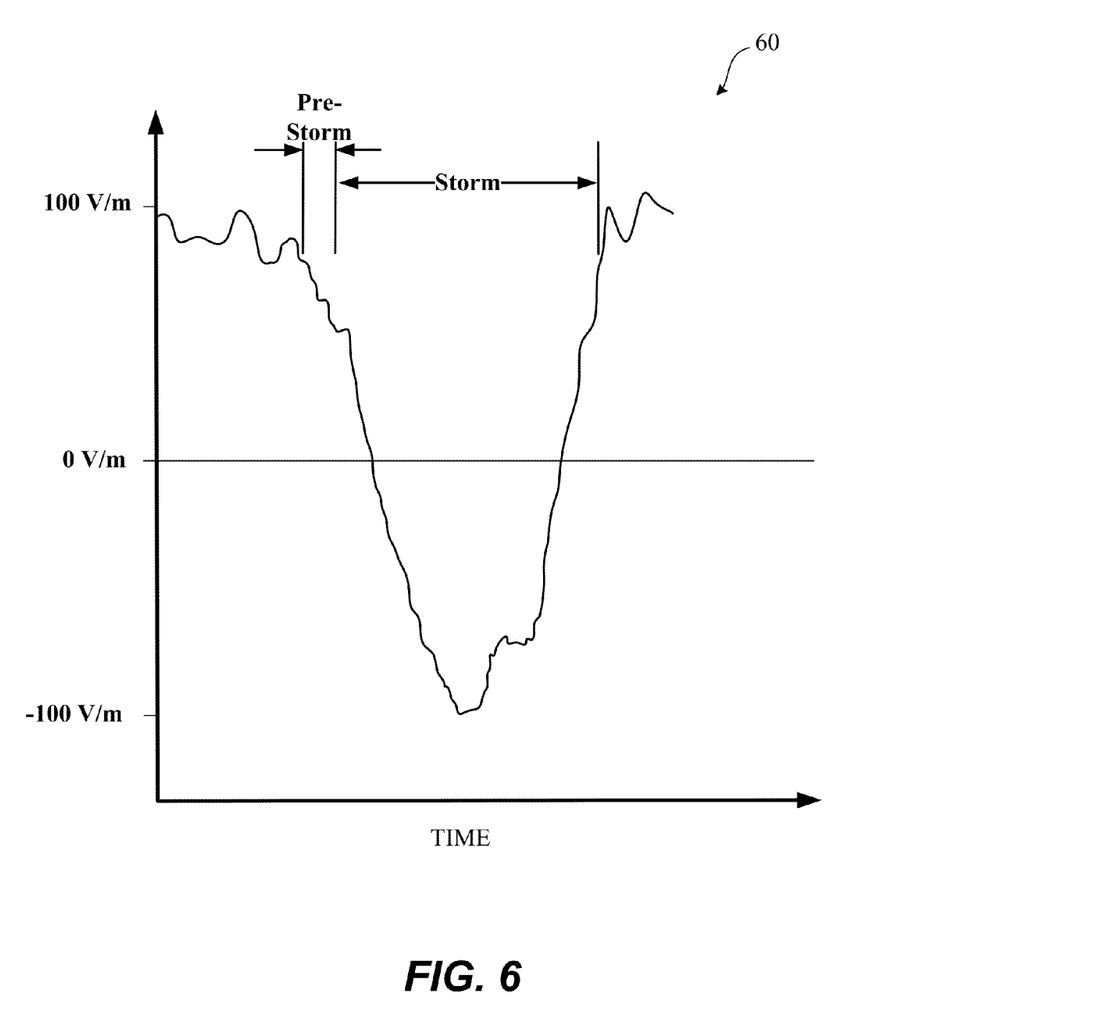
FIG. 6 shows a hypothetical response plot during the passage of a storm front.

FIG. 6 is a hypothetical response plot 60 showing possible variations of the ambient electric field strength during the passage of a storm front. In this example, the nominal field strength of the ambient field is arbitrarily set to be 100 V/m. As the storm approaches, the polarity of the ambient field will reverse, resulting in a marked degradation of field strength as indicated in the "Pre-Storm" section of the plot. At some threshold, the "Storm" will pass and eventually the field strength will return back to normal.

It is understood that similar to storm detection or prediction, earthquakes are known to affect the ambient electric field prior to and during an event. Accordingly, by means of the exemplary embodiments described herein, changes in climate and/or geological behavior can be predicted. Since the exemplary embodiments are of a simple design, they can be easily and cheaply fabricated, resulting in more effective prediction of these events as well as any other activity that may affect the ambient electric field.

As is apparent, it will be understood that many additional changes in the details, materials, steps and arrangement of parts, which have been herein described and illustrated to explain the nature of the invention, may be made by those skilled in the art within the principal and scope of the invention as expressed in the appended claims.

What is claimed is:

1. A chopperless ambient field apparatus, comprising:
a stationary first metallic sensing plate;
a stationary second metallic sensing plate, vertically displaced from and substantially parallel to the first plate;
a transistor-based device having first, second and third terminals;
a first signal line coupled to the first plate and the first terminal of the transistor-based device;
a second signal line coupled to the second plate and the second terminal of the transistor-based device;
a relay circuit coupled to the first and second signal lines;
an electrical parameter detector coupled to the second and third terminals of the transistor-based device;
a protective enclosure disposed about the first and second plates, the transistor-based device, and the electrical parameter detector; and
a closed electric field enclosure disposed about the protective enclosure having a first openable aperture above the first plate and a second openable aperture below the second plate, wherein with control of the apertures and relay, the detector measures AC fields and DC electric fields impinging on the plates.

2. The apparatus of claim 1, wherein the electrical parameter detector is a resistance meter.

3. The apparatus of claim 1, wherein the apertures are camera shutters.

4. The apparatus of claim 1, further comprising a biasing circuit coupled to the first terminal of the transistor-based device.

5. The apparatus of claim 1, wherein the transistor-based device is a MOSFET transistor.

6. A method for measuring ambient fields, comprising:
fixing a first metallic sensing plate and a second metallic sensing plate vertically and substantially parallel from each other;
connecting a first signal line to the first plate and to a first terminal of a transistor-based device having first, second, and third terminals;
connecting a second signal line to the second plate and to the second terminal of the device;
connecting a controllable relay to the first and second signal lines;
connecting an electrical parameter detector to the second and third terminals of the transistor-based device;
disposing a protective enclosure about the first and second plates, the transistor-based device, and the electrical parameter detector;
disposing a closed electric field enclosure about the protective enclosure, the electric field enclosure having a first openable aperture above the first plate and a second openable aperture below the second plate;
closing the relay and the apertures to calibrate the electrical parameter detector; and
opening the relay and the apertures for a predetermined period of time to allow ambient electric fields to impinge on the plates; and measuring the ambient AC fields and DC electric fields via a readout of the electrical parameter detector.

7. The method of claim 6, wherein the relay and apertures are closed for less than a second.

8. The method of claim 7, wherein the relay and apertures are opened for more than 30 minutes.

9. The method of claim 6, wherein the apertures are camera shutters.

10. The method of claim 6, further comprising connecting a biasing circuit to the first terminal of the transistor-based device.

11. The method of claim 6, wherein the transistor-based device is a MOSFET transistor.

12. The method of claim 6, further comprising grounding each of the plates.

* * * * *